United States Patent [19]
Okano

[11] Patent Number: 5,880,589
[45] Date of Patent: Mar. 9, 1999

[54] METHOD AND APPARATUS FOR MAKING DIAGNOSIS OF ELECTROLYTIC CAPACITOR IN OPERATION

[75] Inventor: Masami Okano, Tomioka, Japan

[73] Assignee: Airbag Systems, Co., Ltd., Gunma, Japan

[21] Appl. No.: 810,803

[22] Filed: Mar. 6, 1997

[30] Foreign Application Priority Data

Mar. 15, 1996 [JP] Japan ..................................... 8-086009

[51] Int. Cl.⁶ ............................. G01R 31/00; H01G 9/00
[52] U.S. Cl. ......................... 324/548; 324/551; 340/653
[58] Field of Search ................... 340/635, 653; 324/548, 551

[56] References Cited

U.S. PATENT DOCUMENTS

| | | | |
|---|---|---|---|
| 3,727,129 | 4/1973 | Hummert | 324/548 |
| 4,805,063 | 2/1989 | Kataoka | 324/548 |
| 5,502,375 | 3/1996 | Marek | 324/548 |

FOREIGN PATENT DOCUMENTS

| | | | |
|---|---|---|---|
| 0262571 | 10/1988 | Japan | 324/548 |
| 403269268 | 11/1991 | Japan | 324/548 |

*Primary Examiner*—Josie Ballato
*Assistant Examiner*—Jose M. Solis
*Attorney, Agent, or Firm*—Wenderoth, Lind & Ponack, L.L.P.

[57] ABSTRACT

A charged voltage between the ground and a positive pole of backup capacitor 5 and a ground-casing voltage developed between the ground and a casing of capacitor 5 are determined. When the ground-casing voltage is smaller than a first value, it is judged that capacitor 5 has an opened circuit on its positive pole side; when the ground-casing voltage is larger than a second value, it is judged that capacitor 5 has an opened circuit on its negative pole side. A difference between the ground-casing voltage and the charged voltage is divided by the ground casing voltage so that a coefficient is obtained. When the coefficient is outside a predetermined range of values, it is judged that capacitor 5 is poor in capacitance, which makes it possible to determine, even in operation, whether capacitor 5 functions properly.

12 Claims, 3 Drawing Sheets

METHOD AND APPARATUS FOR MAKING DIAGNOSIS OF ELECTROLYTIC CAPACITOR IN OPERATION

BACKGROUND OF THE INVENTION

1. Field of the Invention

The present invention relates to a method and apparatus for making diagnosis of an electrolytic capacitor in operation, and more particularly to such method and apparatus for determining whether or not the electrolytic capacitor functions properly in operation.

2. Description of the Related Art

For example, in a so-called air bag system which is known as one of vehicle occupant protection systems, there is used an electrolytic capacitor called the large-capacity backup capacitor which serves as a backup power source in the air bag system.

This type of electrolytic capacitor is provided in a vehicle to prevent the air bag system from failing in vehicle occupant protection operation due to cut wires occurring in a circuit between a battery and a power supply circuit in the air bag system due to an accident involving the vehicle carrying the air bag system. The cut wires preventing the battery from supplying its power to each of the element circuits of the air bag system. More specifically, the electrolytic capacitor in the air bag system is used in place of the battery when such, cut wires occur due the accident involving the vehicle, and supplies its power to the air bag system to enable the system to normally function.

In consideration of the importance of its purpose of the backup capacitor in use, in most cases, such an electrolytic capacitor is provided in the air bag system together with its diagnosis circuits for determining deterioration in properties of the electrolytic capacitor, and for checking on circuit connections in the air bag system.

For example, deterioration in capacitance of the electrolytic capacitor causes its predetermined supply voltage to decrease, which makes it impossible for the electrolytic capacitor to function as a backup power source in the air bag system. Consequently, checking of such deterioration in capacitance of the electrolytic capacitor is considerably important. In order to perform such checking or diagnosis operation, various types of capacitance checking or diagnosis devices have been proposed, each of which comprise: a booster circuit for producing a charging voltage of the capacitor by boosting a voltage supplied from the battery to a predetermined voltage; a discharging circuit through which the capacitor is forcibly discharged; and, a counter circuit for measuring a predetermined elapsed time.

However, each of the above-mentioned conventional checking or diagnosis devices requires its own circuit in addition to the element circuits of the air bag system, and, therefore raises the manufacturing cost of the air bag system in total. Further, for example, in most cases, the conventional checking or diagnosis device performs its checking or diagnosis operation only when an engine of the vehicle is turned on by its engine key. In other words, any checking or diagnosis operation is not conducted after the engine is started. Consequently, as for the time interval of its checking or diagnosis operation, the conventional equipment is insufficient to properly perform its function.

Furthermore, When a user drives the vehicle, it is impossible for the conventional equipment to determine whether cut wires occur in the circuit between the positive (or the negative) pole of the backup capacitor and the element circuits of the air bag system.

SUMMARY OF THE INVENTION

It is an object of the present invention to provide a method and apparatus for making diagnosis of an electrolytic capacitor in operation, the method and apparatus being capable of determining whether or not cut wires occur in a circuit between the positive (or the negative) pole of a battery and the element circuits of an air bag system even in a condition in which the electrolytic capacitor serving as a backup capacitor is connected with a battery.

It is another object of the present invention to provide a method and apparatus for making diagnosis of an electrolytic capacitor in operation, the method and apparatus being capable of easily judging, at any desired time, whether or not the electrolytic capacitor serving as a backup capacitor deteriorates in capacitance.

It is further another object of the present invention to provide an apparatus for making diagnosis of an electrolytic capacitor in operation, the apparatus being simple in construction and easily combined with the circuit of the existent air bag system.

It is still further another object of the present invention to provide a method and apparatus for making diagnosis of an electrolytic capacitor in operation without the need for forcible charging and discharging of the electrolytic capacitor.

According to a first aspect of the present invention, the above objects of the present invention are accomplished by providing:

A method for making diagnosis of an electrolytic capacitor in operation, comprising:
measuring a ground-casing voltage developed between the ground and a casing of the electrolytic capacitor having been charged with a dc voltage;
judging that the electrolytic capacitor is opened in circuit of its positive pole side when the ground-casing voltage is smaller than a first predetermined voltage; and
judging that the electrolytic capacitor is opened in circuit of its negative pole side when the ground-casing voltage is larger than a second predetermined voltage.

According to a second aspect of the present invention, the above objects of the present invention are accomplished by providing:

The method for making diagnosis of the electrolytic capacitor in operation, as set forth in the first aspect of the present invention, wherein:
a voltage developed between the ground and a positive pole terminal of the electrolytic capacitor is measured, a difference between which voltage and the ground-casing voltage is divided by the ground-casing voltage in a division process; and
it is judged that the electrolytic capacitor fails when a value resultant from the division process is outside a predetermined range of values.

According to a third aspect of the present invention, the above objects of the present invention are accomplished by providing:

An apparatus for making diagnosis of an electrolytic capacitor in operation, comprising:
a first measuring means for measuring a first voltage developed between the ground and a positive pole terminal of the electrolytic capacitor having been charged with a dc voltage;
a second measuring means for measuring a second voltage developed between the ground and a casing of the electrolytic capacitor;

a calculating means for calculating a judging coefficient through a division process in which a difference between the first voltage and the second voltage is divided by the second voltage; and a failure judging means for judging that the electrolytic capacitor fails when the judging coefficient thus calculated through the calculating means is outside a predetermined range of values.

According to a fourth aspect of the present invention, the above objects of the present invention are accomplished by providing:

The apparatus for making diagnosis of the electrolytic capacitor in operation, as set forth in the third aspect of the present invention, wherein the apparatus further comprises an open-circuit judging means in which:

it is judged that the electrolytic capacitor is opened in circuit of its positive pole side when the second voltage thus measured through the second measuring means is smaller than a first predetermined value; and it is judged that the electrolytic capacitor is opened in circuit of its negative pole side when the second voltage is larger than a second predetermined value.

According to a fifth aspect of the present invention, the above objects of the present invention are accomplished by providing:

In an apparatus for making diagnosis of an electrolytic capacitor in operation as to whether or not the electrolytic capacitor serving as a backup power source functions properly, the electrolytic capacitor being connected in parallel with a stabilized power source circuit between the ground and a positive pole voltage input terminal of the circuit in an input side of the stabilized power source circuit which receives a voltage supplied from the battery to stabilize it, and converted into a desired voltage being issued from the circuit, the improvement wherein the apparatus comprises:

a pair of voltage dividing resistors which are connected with each other in series, and connected in parallel with the electrolytic capacitor; and a central processing unit (CPU) functioning to convert an analog input signal into a digital output signal;

the central processing unit (CPU) receiving a pair of voltages, one of which voltages is developed at a junction between the pair of voltage dividing resistors to form a first voltage developed between the ground and a positive pole terminal of the electrolytic capacitor, the other of which voltages forms a second voltage developed between the ground and a casing of the electrolytic capacitor;

the central processing unit (CPU) calculating a judging coefficient through a division process in which a difference between the first and the second voltage is divided by the second voltage, so that the central processing unit (CPU) judges that the electrolytic capacitor fails when the judging coefficient is outside a predetermined range of values.

According to a sixth aspect of the present invention, the above objects of the present invention are accomplished by providing:

The apparatus for making diagnosis of the electrolytic capacitor in operation, as set forth in the fifth aspect of the present invention, wherein:

the central processing unit (CPU) judges that the electrolytic capacitor is opened in circuit of its positive pole side when the second voltage is smaller than a first predetermined value; and the central processing unit (CPU) judges that the electrolytic capacitor is opened in circuit of its negative pole side when the second voltage is larger than a second predetermined value.

DESCRIPTION OF THE PREFERRED EMBODIMENTS

Figure 1:
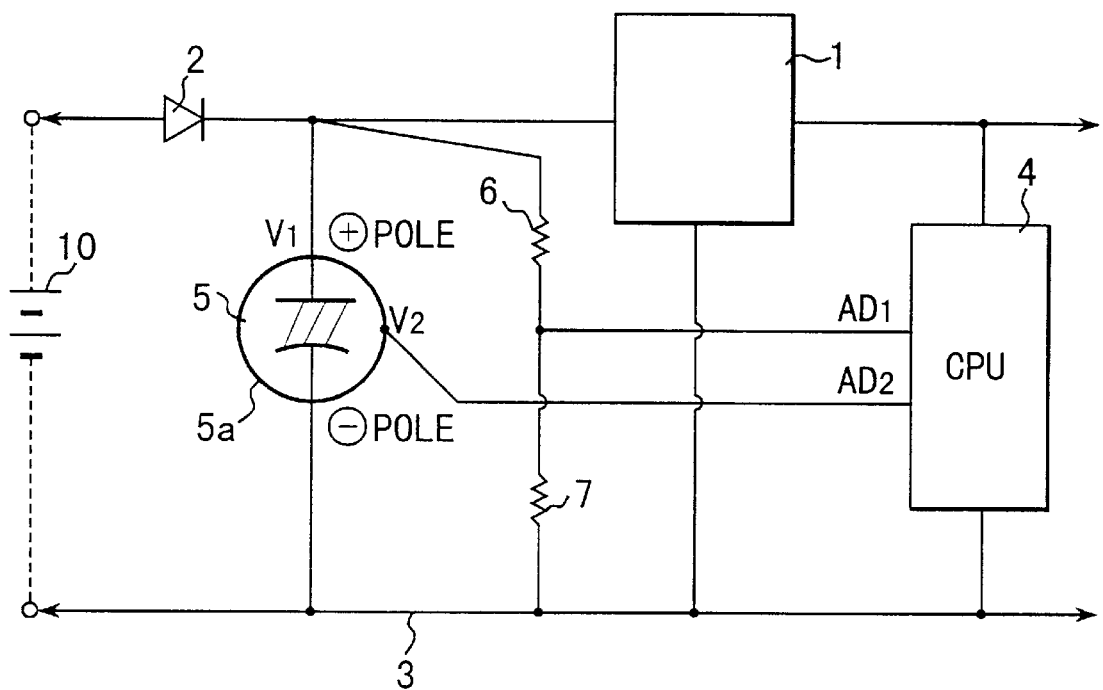
FIG. 1 is a circuit diagram of an embodiment of the apparatus for making diagnosis of the electrolytic capacitor in operation, according to the present invention.

Hereinbelow, the present invention will be described in detail with reference to the accompanying drawings which illustrate an embodiment of the present invention.

Incidentally, any parts and arrangements appearing in the following description of the present invention are not limited to that of the embodiment of the present invention shown in the drawings since many changes and modifications can be made thereto without departing from the spirit of the present invention.

First, with reference to FIG. 1, an embodiment of an apparatus of the present invention (hereinafter referred to as the present apparatus) for making diagnosis of an electrolytic capacitor in operation will be described.

In use, the present apparatus is combined with an electric power source which receives a voltage issued from a battery 10 to supply a predetermined stabilized voltage to element circuits of a so-called air bag system.

More specifically, as shown in FIG. 1, a stabilized power source circuit 1 receives the voltage issued from the battery 10, stabilizes and converts the voltage into a predetermined DC voltage. The stabilized power source circuit 1 has one of its input terminals connected with a positive pole terminal of a battery 10 through a protective diode 2 for preventing current from reverse flowing into the stabilized power source circuit 1, and the other of the input terminals connected with a ground cable 3 which is connected with a negative pole terminal of the battery 10. Further, the stabilized power source circuit 1 has its output terminal connected with both the element circuits of the air bag system and a power line of a central processing unit (hereinafter referred to as the CPU) 4.

In the input side of the stabilized power source circuit 1, an electrolytic capacitor (i.e., backup capacitor) 5 has its positive pole terminal connected with a cathode of the protective diode 2, its negative pole terminal connected with the ground line 3.

This backup capacitor 5 is provided with a casing 5a, a positive pole terminal and a negative pole terminal both insulated from the casing 5a. The casing 5a is connected with a second A/D input terminal AD2, as shown in FIG. 1.

Further, the backup capacitor 5 is connected in parallel with a pair of voltage dividing resistors 6, 7 which are connected with each other in series. A junction between the voltage dividing resistors 6, 7 is connected with a first A/D input terminal AD1 of the CPU 4, as shown in FIG. 1.

Incidentally, the first and the second A/D input terminals of the CPU 4 are input terminals of an analog/digital converter (not shown). Consequently, voltage signals received in these first and the second A/D input terminals of the CPU 4 are converted into digital signals adapted for processing in the CPU 4.

Now, with reference to a flowchart shown in FIG. 2, a method or process for diagnosing of the electrolytic capacitor or backup capacitor 5 in operation, carried out by the CPU 4, will be described.

Figure 2:
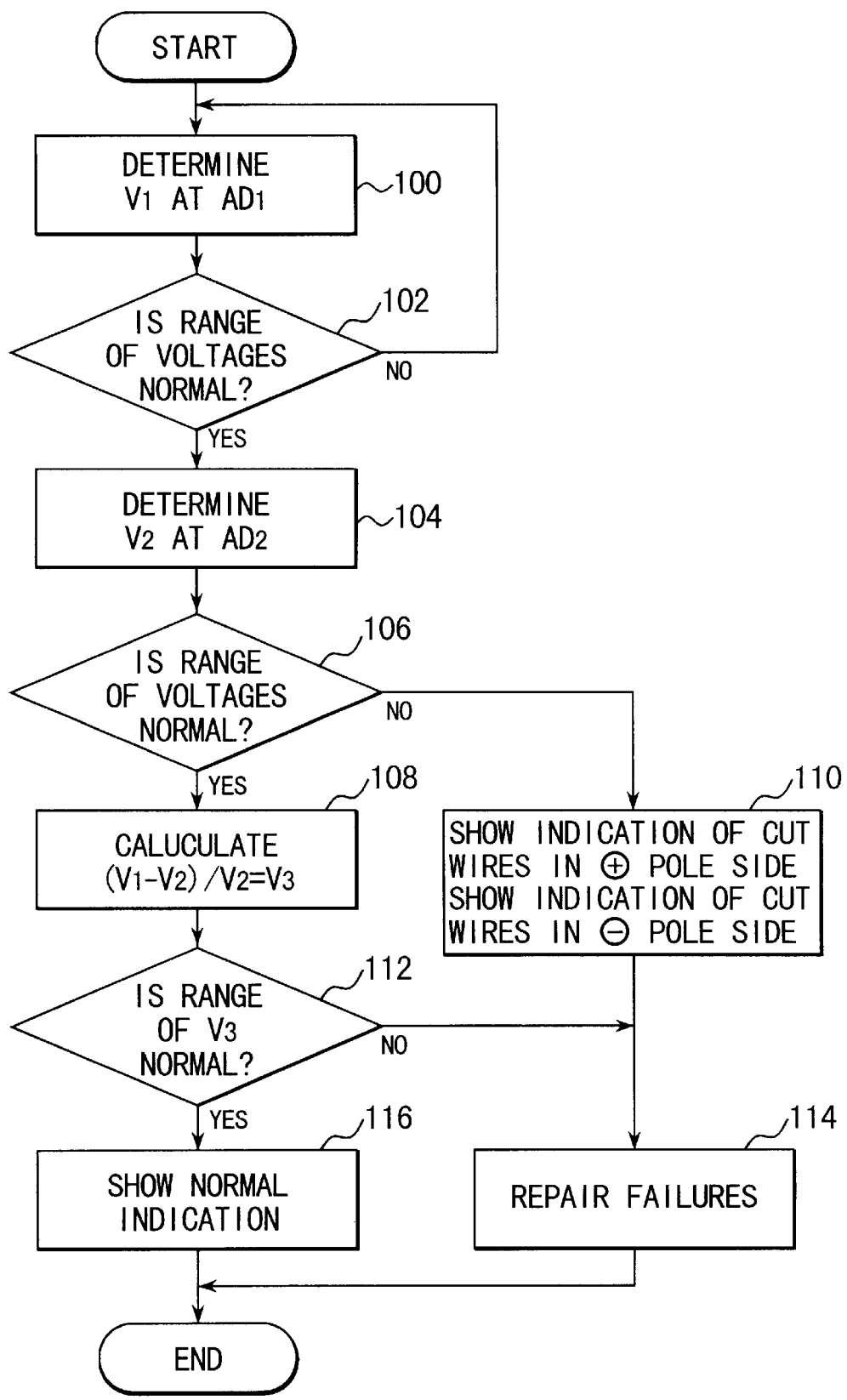
FIG. 2 is a flowchart of procedures or processing steps in the method for making diagnosis of the electrolytic capacitor in operation, which is executed by the central processing unit (CPU) of the apparatus shown in FIG. 1.

In operation, as shown in FIG. 2, in a step 100, a voltage, which is applied to the first A/D input terminal AD1 of the CPU 4, is determined as a first voltage V1 developed at a positive pole terminal of the backup capacitor 5. The step 100 is followed by a subsequent step 102, in which it is judged whether the first voltage V1 thus determined is inside a predetermined normal range of voltages.

Although such normal range of voltages may vary, depending on various factors, for example such as voltages of the battery 10, voltage drops in the protective diode 2 and like factors, a range of from 10 to 16 volts is defined as a normal range in the embodiment of the present invention.

When the first voltage V1 is outside the normal range of voltages described above (i.e., "NO" is selected in the step 102), the processing procedure in the flowchart of FIG. 2 returns back to the step 100 until "YES" is selected in the step 102. When it is judged that the first voltage V1 is inside the normal range of voltages (i.e., "YES" is selected in the step 102), the processing procedure goes to a subsequent step 104. In the step 104, a voltage, which is applied to the second A/D input terminal AD2 of the CPU 4, is determined as a second voltage (i.e., ground-casing voltage) V2 developed between the casing 5a of the backup capacitor 5 and the ground (i.e., a negative pole terminal of the backup capacitor 5).

The step 104 is followed by a subsequent step 106, in which it is judged whether the second voltage V2 is inside a predetermined normal range of voltages, preferably of from 0.5 to 1.5 volts in the embodiment of the present invention.

Consequently, when the second voltage V2 is larger than 0.5 volt and smaller than 1.5 volts, "YES" is selected in the step 106 which is followed by a subsequent step 108. On the other hand, when "NO" is selected in the step 106, the processing procedure goes to a step 110, as follows.

In the step 110, when the second voltage V2 is smaller than 0.5 volt which is a first predetermined value V1, it is judged that the backup capacitor 5 has an opened circuit on its positive pole side, i.e. it is judged that cut wires have occurred in the circuit of the positive pole side of the backup capacitor 5. On the other hand, when the second voltage V2 is larger than 1.5 volts (i.e. when the second voltage V2 is larger than a second predetermined value V1), it is judged that the backup capacitor 5 has an opened circuit on its negative pole side, i.e. it is judged that cut wires have occurred in the circuit of the negative pole side of the backup capacitor 5, as shown in FIG. 2. The step 110 is followed by its subsequent step 114 in which the repairs of the failure such as cut wires are made. After completion of such repairs, the processing procedure goes to "END" of the flowchart, as shown in FIG. 2. The failure, for example such as failures in the backup power source is indicated in its contents by means of an appropriate warning means such as warning lamps, buzzers and the like.

On the other hand, in the preceding step 106, when the second voltage V2 is judged to be inside the normal range of voltages (i.e. "YES" is selected), it is necessary to judge whether or not the backup capacitor 5 is poor in capacitance by the use of a judging coefficient V3. Consequently, the step 106 is followed by its subsequent step 108 in which the judging coefficient, i.e. ratio V3 of (the voltage V1−the voltage V2)/(the voltage V2) is calculated, as shown in FIG. 2.

The step 108 is followed by its subsequent step 112 in which it is judged whether or not the judging coefficient V3 is inside a predetermined normal range of values. This normal range of values may vary, depending on individual circuits. In the embodiment of the present invention, a range of from 5.66 to 31 is a preferable one of such normal range of values.

In a condition described above (i.e. in the step 112), when it is judged that the judging coefficient V3 is inside the predetermined normal range of values (i.e. "YES" is selected), the processing procedure goes to a step 116 following the step 112. In the step 116, it is indicated that the judging coefficient V3 is inside the predetermined normal range of values, by the use of an appropriate indication means. After that, the processing procedure goes to "END" in the flowchart shown in FIG. 2. On the other hand, in the step 112, when it is judged that the judging coefficient V3 is outside the predetermined normal range of values (i.e. "NO" is selected), the processing procedure goes to the step 114 in which the repairs of the failures are made, as described above. After completion of the repairs in the step 114, the processing procedure goes to "END" in the flowchart shown in FIG. 2.

Now, with reference to FIG. 3, the reason why the ground-casing voltage V2 of the backup capacitor 5 is measured will be described together with the reason why the judging coefficient V3 is capable of judging whether or not the capacitor 5 is poor in capacitance.

Figure 3:
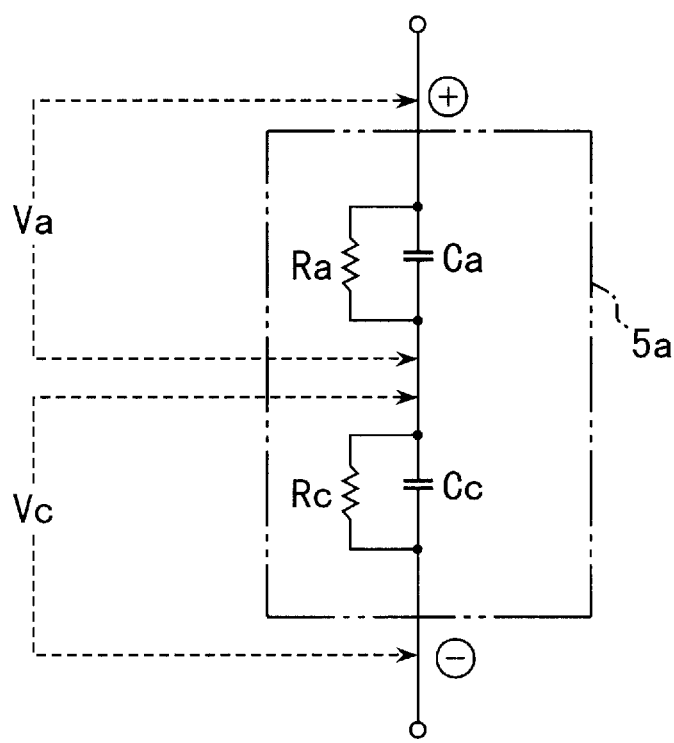
FIG. 3 is an equivalent circuit diagram of the electrolytic capacitor.

FIG. 3 shows one of well-known equivalent circuits of the electrolytic capacitor serving as the backup capacitor 5. In general, the electrolytic capacitor has an aluminum casing 5a in which: a positive foil (not shown) with the dielectric is oppositely disposed from a negative foil (not shown) with the dielectric through paper saturated with the electrolyte; and, lead wires connected with the corresponding foils to extend outward through the casing 5a.

The electrolytic capacitor having the above construction is seen as being equal in construction to an equivalent circuit (shown in FIG. 3) in which: a capacitance Ca developed on the positive foil (not shown) is connected in series with a capacitance Cc developed on the negative foil (not shown); the capacitance Ca and the capacitance Cc are connected in parallel with their internal resistances Ra and Rc, respectively; and, a plus terminal and a minus terminal are not directly connected with the casing 5a, but communicate with each other through the paper saturated with the electrolyte, as shown in FIG. 3.

In general, a ratio of Cc/Ca is so set as to be within a range of from about 8 to about 10.

Due to this, the electrolytic capacitor represented by the above equivalent circuit has a capacitance C which is equal to a value of $(C_a \times C_c/(C_a+C_c))$ when subjected to AC voltage. In the embodiment of the present invention, since the electrolytic capacitor serving as the backup capacitor 5 is subjected to DC voltage and is discharged while charged in use, an effective capacitance of the backup capacitor 5 is reduced.

The reason why the effective capacitance is reduced is that voltage distribution in charging with DC voltage does not depend on a capacitance ratio of Cc/Ca, but depends on an internal resistance ratio of Ra/Rc.

On the other hand, the internal resistance Ra is resulted from the dielectric, i.e. oxide film formed on the foil through chemical treatments, and is therefore high, while the internal resistance Rc is resulted from the dielectric, i.e. oxide film formed through natural oxidation, and is therefore relatively low. Consequently, a ratio of Ra/Rc is large.

More particularly, the relation between these factors are as follows: namely, the ratio of Ra/Rc is larger than the ratio of Cc/Ca, so that the ratio of Va/Vc is larger than the ratio of Cc/Ca, where Va represents a voltage drop across the internal resistance Ra, and Vc represents a voltage drop across the internal resistance Rc.

As a result, the following relation is established: namely, a value of (Va×Ca) is larger than that of (Vc×Cc).

When a strength of electric charge on Ca is denoted by the reference character Qa, and that on Cc is denoted by the reference character Qc, it is possible to describe that: Qa=Va×Ca; and, Qc=Vc×Cc. Consequently, in view of the above relation, it is possible to describe that Qa is larger than Qc.

Consequently, when the positive pole terminal of the electrolytic capacitor having been charged with a dc voltage as described above is connected with its negative pole terminal to initiate the discharge in a condition in which the capacitance Qa is larger than the capacitance Qc, the amount of electric charge equal to a difference of (Qa−Qc) still remains as a residual charge after the discharge finishes, which makes it impossible for the discharge to be completely accomplished in the electrolytic capacitor.

In other words, in the circuit using a dc voltage, the discharge is completely accomplished only in the smaller capacitance (i.e., Cc) side of the electrolytic capacitor.

Consequently, in this case, the effective capacitance, which is denoted by the reference character "Ceff", is represented by the following equation:

$$Ceff=Qc/V=Cc \times Vc/V=Cc \times Vc/(Va+Vc)$$

where: V is a dc voltage applied across the electrolytic capacitor.

Further, when the above equation has its individual terms divided by the voltage drop Vc, the effective capacitance is represented as follows:

$$Ceff\ Cc/(Va/Vc+1)$$

Consequently, when the capacitance Cc is a known value derived from the manufacturing data, it is possible to calculate the effective capacitance Ceff by measuring both the voltage drops Va and Vc.

It is also possible to easily judge, without calculating the effective capacitance Ceff, whether or not the effective capacitance Ceff is normal by comparing a ratio of Va/Vc with the corresponding normal ratio thereof.

In the embodiment of the present invention, the ground-casing voltage V2 corresponds to the voltage drop Vc, and the difference between the first voltage V1 and the second voltage V2, i.e., (V1−V2) corresponds to the voltage drop Va.

Further, in the embodiment of the present invention described above, the effective capacitance Ceff is not directly calculated by the use of the above equation (i.e., Ceff=Cc/(Va/Vc+1). In the embodiment of the present invention, in order to judge whether or not the backup capacitor 5 is poor in capacitance, the ratio of Va/Vc, i.e., (V1−V2)/V2 is first calculated as described above. Then, based on the thus calculated ratio, it is judged whether or not the backup capacitor 5 is poor in capacitance.

In the above embodiment of the present invention, the CPU 4 has its first A/D input terminal connected with the junction between the voltage dividing resistors 6 and 7 and its second A/D input terminal connected with the casing 5a of the backup capacitor 5, so that the steps 100, 104 are conducted to realize a first and a second measuring means. The first measuring means measures the first voltage V1 developed between the ground and the positive pole terminal of the backup capacitor 5 having been charged with a dc voltage. On the other hand, the second measuring means measures the second voltage V2 developed between the ground and the casing 5a of the backup capacitor 5.

As for the flowchart shown in FIG. 2, in the processing procedure of the flowchart executed by the CPU 4, the step 108 may realize a calculating means for calculating a judging coefficient (i.e., the ratio of Va/Vc) through a division process in which a difference between the first voltage V1 and the second voltage V2 is divided by the second voltage V2.

The step 112 may realize a failure judging means for judging that the backup capacitor 5 fails when the judging coefficient (i.e., Va/Vc) thus calculated through the calculating means is outside a predetermined range of values.

The step 110 may realize an open-circuit judging means in which: it is judged that the backup capacitor 5 has an opened circuit on its positive pole side when the second voltage V2 thus measured through the second measuring means is smaller than a first predetermined value; and, it is judged that the backup capacitor 5 has an opened circuit on its negative pole side when the second voltage V2 is larger than a second predetermined value.

As described above, in the present invention: the equivalent circuit of the electrolytic capacitor 5 is used to measure the so-called divided voltages (i.e., Va and Vc); and, based on the ratio of the thus measured values (i.e., Va/Vc), it is judged whether or not cut wires occur in the circuits connected with the opposite terminals of the electrolytic capacitor 5, and also judged whether of not the capacitor 5 is poor in capacitance; whereby the present invention is capable of judging the condition in operation of the electrolytic capacitor 5 on the basis of the thus measured voltages developed at predetermined positions. Consequently, in the present invention, it is possible to judge the condition of electrolytic capacitor 5 at any desired time, which improves the vehicle occupant protection system such as the air bag system and the like in reliability.

Further, in the present invention, dc voltage is measured, which may reduce an error in timing of the measurement in comparison with the measurement of ac voltage, and may result in a very reliable judgment.

Furthermore, in the measurement of voltage according to the present invention, in contrast with the prior art, the electrolytic capacitor 5 is not forcibly charged and discharged, and, therefore not affected in its service life.

Still further, in the apparatus of the present invention for making diagnosis of the electrolytic capacitor 5 in operation as set forth in the third and the eighth aspects of the present invention, in contrast with the prior art, there is no need of circuits for forcibly charging and discharging the electrolytic capacitor 5 in the measurement, which may simplify in construction and reduce the manufacturing cost the apparatus of the present invention.

Further, in the apparatus of the present invention for making diagnosis of the electrolytic capacitor 5 in operation as set forth in the third and the eighth aspects of the present invention, in contrast with the prior art, there is no need of boosting the voltage of the battery to a predetermined level through a so-called switching stabilization power source circuit to apply such predetermined level voltage to the electrolytic capacitor 5. In other words, when the apparatus of the present invention is free from any power shortage in its power line, it is possible to omit the use of the above-mentioned switching stabilization power source circuit in the apparatus of the present invention, which may eliminate the electrical noise due to this switching stabilization power source circuit to enable the measurement results to be free from the affect of such noise in the apparatus of the present invention.

Further, in the present invention, since the electrolytic capacitor 5 has its positive pole, negative pole and the casing 5a formed into three measuring points, it is necessary to wire these three measuring points. Such wiring to the three measuring points of the electrolytic capacitor 5 forms a three-point suspension construction which may firmly support the electrolytic capacitor 5 to improve it in resistance to an earthquake. Consequently, the apparatus of the present invention is substantially free from any fear of cut wires even when subjected to vibrations.

What is claimed is:

1. A method for diagnosing an electrolytic capacitor, the method comprising:

applying an operation voltage to the electrolytic capacitor;

measuring a voltage developed between the ground and a positive pole terminal of the electrolytic capacitor, in order to obtain a first voltage;

measuring a ground-casing voltage developed between the ground and a casing of the electrolytic capacitor, in order to obtain a second voltage;

determining a difference between the first voltage and the second voltage;

dividing the difference by the second voltage to obtain a result value; and judging whether the electrolytic capacitor has failed by comparing the result value with a predetermined range of values.

2. The method for diagnosing an electrolytic capacitor as set forth in claim 1, the method further comprising:

determining whether the electrolytic capacitor has an opened circuit by comparing the second voltage with a first predetermined value and a second predetermined value;

wherein the electrolytic capacitor is determined to have opened circuit on its positive pole side when the second voltage is smaller than the first predetermined value, and the electrolytic capacitor is determined to have opened circuit on its negative pole side when the second voltage is greater than the second predetermined value.

3. An apparatus for diagnosing an electrolytic capacitor, said apparatus comprising:

a first measuring means for measuring a first voltage developed between the ground and a positive pole terminal of said electrolytic capacitor having been charged with a DC voltage;

a second measuring means for measuring a second voltage developed between the ground and a casing of said electrolytic capacitor;

a calculating means for calculating a judging coefficient through a division process in which a difference between the first voltage and the second voltage is divided by the second voltage; and a failure judging means for judging that said electrolytic capacitor has failed when the judging coefficient calculated by said calculating means is outside a predetermined range of values.

4. The apparatus for diagnosing the electrolytic capacitor, as set forth in claim 3, wherein the apparatus further comprises an open-circuit judging means for judging whether said electrolytic capacitor has an opened circuit on its positive pole side when the second voltage measured by said second measuring means is smaller than a first predetermined value; and for judging whether said electrolytic capacitor has an opened circuit on its negative pole side when the second voltage is larger than a second predetermined value.

5. An apparatus for diagnosing an electrolytic capacitor as to whether or not the electrolytic capacitor serving as a backup power source functions properly, the electrolytic capacitor being connected in parallel with a stabilized power source circuit between the ground and a positive pole voltage input terminal of the circuit in an input side of the stabilized power source circuit which receives a voltage supplied from a battery to stabilize it, and the received voltage being converted into a desired voltage issued from the circuit, the apparatus comprising:

a pair of voltage dividing resistors which are connected with each other in series, and connected in parallel with said electrolytic capacitor; and a central processing unit (CPU) functioning to convert an analog input signal into a digital output signal;

said central processing unit (CPU) receiving a pair of voltages, one of the pair of voltages is developed at a junction between said pair of voltage dividing resistors to form a first voltage developed between the ground and a positive pole terminal of said electrolytic capacitor, the other of the pair of voltages forms a second voltage developed between the ground and a casing of said electrolytic capacitor:

said central processing unit (CPU) calculating a judging coefficient through a division process in which a difference between said first and said second voltage is divided by said second voltage, so that said central processing unit (CPU) judges that said electrolytic capacitor fails when said judging coefficient is outside a predetermined range of values.

6. The apparatus for diagnosing the electrolytic capacitor, as set forth in claim 5, wherein:

said central processing unit (CPU) judges that said electrolytic capacitor has an opened circuit on its positive pole side when the second voltage is smaller than a first predetermined value; and said central processing unit (CPU) judges that said electrolytic capacitor has an opened circuit on its negative pole side when the second voltage is larger than a second predetermined value.

7. The apparatus for diagnosing the electrolytic capacitor, as set forth in claim 5, wherein:

the stabilized power source circuit functions to supply power to an air bag system; and said central processing unit (CPU) functions to control the air bag system, in operation.

8. The apparatus for diagnosing the electrolytic capacitor, as set forth in claim 6, wherein:

the stabilized power source circuit functions to supply power to an air bag system; and said central processing unit (CPU) functions to control the air bag system in operation.

9. An apparatus for diagnosing an electrolytic capacitor, the apparatus comprising:

a pair of voltage dividing resistors which are connected with each other in series with a junction in between, said pair of voltage dividing resistors being connected in parallel with the electrolytic capacitor;

a processor connected to said junction between said voltage dividing resistors in order to obtain a first voltage developed between the ground and a positive pole terminal of the electrolytic capacitor;

said processor also being connected to a casing of the electrolytic capacitor in order to obtain a second voltage developed between the ground and the casing;

wherein said processor can determine whether the electrolytic capacitor has failed by calculating a judging coefficient through a division process in which a difference between the first voltage and the second voltage is divided by the second voltage, the judging coefficient being compared to a predetermined range of values.

10. The apparatus for diagnosing an electrolytic capacitor as set forth in claim 9, wherein said processor is connected to said junction between said voltage dividing resistors through a first A/D input terminal, said processor is connected to the casing of the electrolytic capacitor through a second A/D input terminal, and said processor converts the first voltage and the second voltage into digital signals.

11. The apparatus for diagnosing an electrolytic capacitor as set forth in claim 9, wherein said processor can determine whether the electrolytic capacitor has an opened circuit by comparing the second voltage with a first predetermined value and a second predetermined value, the electrolytic capacitor being determined to have opened circuit on its positive pole side when the second voltage is smaller than the first predetermined value, and the electrolytic capacitor being determined to have opened circuit on its negative pole side when the second voltage is greater than the second predetermined value.

12. The apparatus for diagnosing an electrolytic capacitor as set forth in claim 9, wherein the electrolytic capacitor operates as a backup power source and is connected in parallel with a stabilized power source between the ground and a positive pole voltage input terminal in an input side of the stabilized power source which receives a voltage supplied from a battery to stabilize it, and the received voltage being converted into a desired voltage issued from the stabilized power source.

* * * * *